(12) United States Patent
Yan et al.

(10) Patent No.: US 7,528,677 B2
(45) Date of Patent: May 5, 2009

(54) TEMPERATURE COMPENSATION ATTENUATOR

(76) Inventors: Yuejun Yan, Unit D, 16th Floor, West, Aidi Building, Binhe Road, Futian District, Shenzhen (CN) 518045;
Yuepeng Yan, Unit D, 16th Floor, West, Aidi Building, Binhe Road, Futian District, Shenzhen (CN) 518045

( * ) Notice: Subject to any disclaimer, the term of this patent is extended or adjusted under 35 U.S.C. 154(b) by 0 days.

(21) Appl. No.: 12/106,408

(22) Filed: Apr. 21, 2008

(65) Prior Publication Data
US 2008/0211606 A1   Sep. 4, 2008

Related U.S. Application Data

(63) Continuation-in-part of application No. 10/597,985, filed as application No. PCT/CN2005/000586 on Apr. 28, 2005, now Pat. No. 7,362,196.

(30) Foreign Application Priority Data
May 18, 2004  (CN) .................... 2004 1 0027307

(51) Int. Cl.
    *H01P 1/22*  (2006.01)

(52) U.S. Cl. .................................. 333/81 R; 333/81 A
(58) Field of Classification Search ............... 333/81 A, 333/81 R; 338/216
    See application file for complete search history.

(56) References Cited

U.S. PATENT DOCUMENTS

| 5,332,981 | A  | * | 7/1994 | Mazzochette et al. | ..... 333/81 R |
| 6,472,949 | B1 | * | 10/2002 | Yamazaki et al. | ......... 333/81 R |
| 6,903,621 | B2 | * | 6/2005 | Malcolm et al. | .......... 333/81 A |

* cited by examiner

*Primary Examiner*—Stephen E Jones
(74) *Attorney, Agent, or Firm*—Matthais Scholl P.C.; Matthias Scholl

(57) ABSTRACT

A temperature compensation attenuator comprises a base, a serial film thermistor and a parallel film resistor on the base, an input terminal and an output terminal which are connected to the serial film thermistor The serial film resistor is at least partially a film thermistor and the parallel film resistor is not a thermistor. The attenuators can be applied in various circuits and systems utilizing high frequency waves or microwaves, and more particularly, are suitable for use in mobile communication systems, satellite communication systems, satellite navigational systems, and radar systems which require strict temperature characteristics.

12 Claims, 5 Drawing Sheets

TEMPERATURE COMPENSATION ATTENUATOR

CROSS REFERENCE TO RELATED APPLICATIONS

This application is a continuation in part of U.S. Ser. No 10/597,985 filed on Aug. 15, 2006, now U.S. Pat. No. 7,362, 196, which is a National Stage Application of International Patent Application No. PCT/CN 2005/000586, with an international filing date of Apr. 28, 2005, which is based on Chinese Patent Application No. 200410027307.7, filed May 18, 2004. The contents of all of these specifications are incorporated herein by reference

BACKGROUND OF THE INVENTION

1. Field of the Invention

The invention relates to temperature compensation attenuators for compensating temperature characteristics of high frequency or microwave devices and systems used in electronics and communication. The attenuators can be applied in various circuits and systems utilizing high frequency waves or microwaves, and more particularly, are suitable for use in mobile communication systems, satellite communication systems, satellite navigational systems, and radar systems which require strict temperature characteristics.

2. Description of the Related Art

Current techniques for reducing the temperature drift of high frequency or microwave active devices are quite complex, utilize many applied components, and exhibit lengthy R&D periods, high cost, and high rate of failure. For example, the gain of high frequency or microwave power amplifiers, and thus their power output, varies with external temperature, seriously deteriorating the characteristics and stability of the amplifiers and even of the entire systems. To reduce the variance in the gain and the power of high frequency or microwave power amplifiers resulting from the variance in environmental temperature, many active devices, such as temperature detectors, power couplers, wave detectors, programmable signal processors, storage, and preamplifiers with automatic gain control (AGC) and automatic power control (APC) capabilities are included in the amplifiers themselves, their power sources and their control systems.

While resolving the temperature drift characteristics, several features of the devices must be satisfied:

(1) wideband characteristic;
(2) minimal refection coefficient for both the input and the output terminals;
(3) high isolation for both the input and the output terminals; and
(4) the characteristic impedance of both the input and the output terminals complies with the requirement of the access system, for example, 50 Ohm or 75 Ohm.

U.S. Pat Appl. Publ. U.S 2007/0182523 discloses a temperature compensation attenuator comprising a thermistor and a resistor the resistance of which is nearly constant with temperature. For practical fabrication purposes, not the entire thermistor surface needs to have resistance varying with temperature. Besides, temperature compensation attenuator can also be achievable without electronically connecting the top side of the film resistor to the bottom side of the film thermistor.

BRIEF DESCRIPTION OF THE INVENTION

One objective of the invention is to provide a temperature compensation attenuator to realize the compensation of the temperature characteristic of high frequency or microwave active devices and systems in electronics and communications.

In one embodiment of the invention described herein provided is a temperature compensation attenuator comprising a base; a serial film thermistor having two ends; a parallel film resistor; an input terminal; and an output terminal.

In one class of this embodiment, the serial film thermistor and the parallel film resistor are disposed on the base.

In another class of this embodiment, the input terminal and the output terminal are connected to the two ends of the serial film thermistor.

In another class of this embodiment, the serial film thermistor comprises a film thermistor (7) and a film resistor.

In another class of this embodiment, only a portion of the thermistor has resistance varying with temperature.

In another class of this embodiment, the parallel film resistor does not comprise a thermistor.

In another class of this embodiment, the serial film thermistor has a negative temperature coefficient or a positive temperature coefficient.

In another class of this embodiment, the attenuator is a π-type attenuator, a T-type attenuator, or a bridge-type attenuator.

In another class of this embodiment, the serial film thermistor is a thick film thermistor or a thin film thermistor.

In another class of this embodiment, the parallel film resistor is a thick film resistor or a thin film resistor.

In another class of this embodiment, the attenuator is fabricated in a coaxial connector, and the coaxial connector is an SMA coaxial connector, an N-type coaxial connector, and a BNC connector.

As a result, by utilizing the serial film thermistor of the invention, a wideband temperature compensation attenuator with a distributed parameter circuit structure is constructed wherein the amount of attenuation varies with temperature. By connecting the temperature compensation attenuator of the invention to a high frequency or microwave active circuit, it can compensate for the variance of the gain of the high frequency or microwave active device or the drift of the frequency characteristic of the active device resulting from temperature variance. Even under large environmental temperature variance, it can still ensure the stability of the gain of the high frequency or microwave active device and compensate for the drift of the frequency characteristic of the active device.

DETAILED DESCRIPTION OF THE INVENTION

Figure 1:
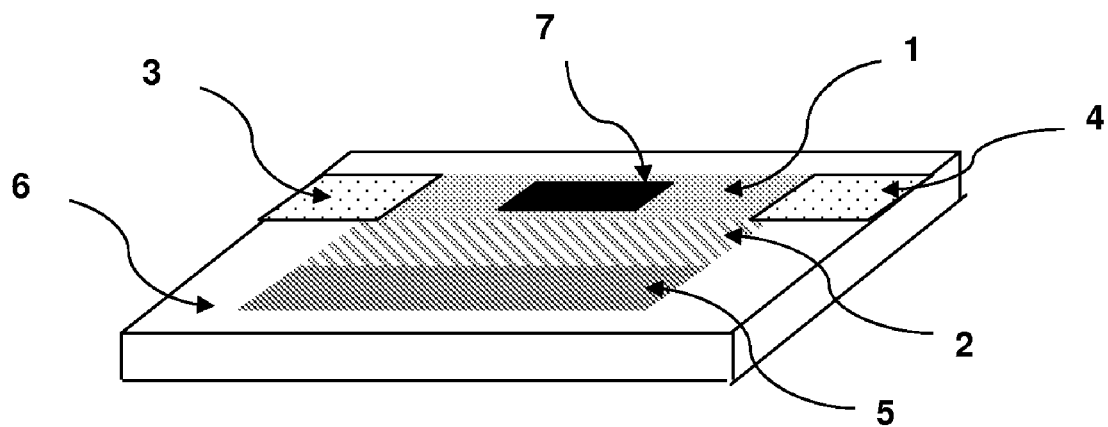
FIG. 1 is a schematic drawing of a temperature compensation attenuator according to the first embodiment of the invention.

With reference to FIG. 1, the temperature compensation attenuator according the first embodiment of the invention comprises a base 6, a serial film thermistor 1 and a parallel film resistor 2. The serial film thermistor 1 is a part film thermistor 7, and a part resistor. The film thermistor 7 has a negative temperature coefficient (NTC). The two ends of the serial film thermistor 1 are connected to an input terminal 3 and an output terminal 4 respectively. This configuration is favorable for laser-adjusting of the resistance value. The film thermistor 7 is disposed on the serial film thermistor 1 through surface mounting or printing.

The parallel film resistor 2 is a general-type film resistor, the resistance value of which is nearly constant with temperature. One end (side) of the parallel film resistor 2 is connected to a ground terminal 5 and the other end (side) is connected to the input-output terminal. The serial film thermistor 1, the parallel film resistor 2 and the ground terminal 5 form a π-type attenuator on the surface of the base 6.

A resistor connected in series to the input and output terminals is termed a serial resistor and a resistor of which one end connected to the ground terminal is termed a parallel resistor. Attenuators according to the invention are classified as π-type attenuators, T-type attenuators, or bridge-type attenuators.

When temperature increases, the resistance value of the film thermistor 7 decreases; thus the attenuation of the π-type attenuator decreases to realize stable compensation. Similarly, when temperature decreases, the resistance value of the film thermistor 7 increases; thus the attenuation of the π-type attenuator increases to realize stable compensation.

If a thermistor having a positive temperature coefficient were selected as the parallel film resistor 2 and a thermistor having a negative temperature coefficient were selected as the serial film resistor 1, temperature compensation could be achieved more perfectly. However, using two thermistors in the attenuator design would cause much higher costs with respect to design and manufacture. To solve this problem, advantage has been taken of the fact that the serial resistor largely determines the attenuation, and the influence of the parallel resistor on attenuation is negligible. Accordingly, one thermistor and one resistor are being used in embodiments of the invention leading to significantly lower costs.

Serial film resistors or parallel film resistors can be thick film resistors or thin film resistors, and film thermistors can be thick film thermistors or thin film thermistors.

Figure 2:
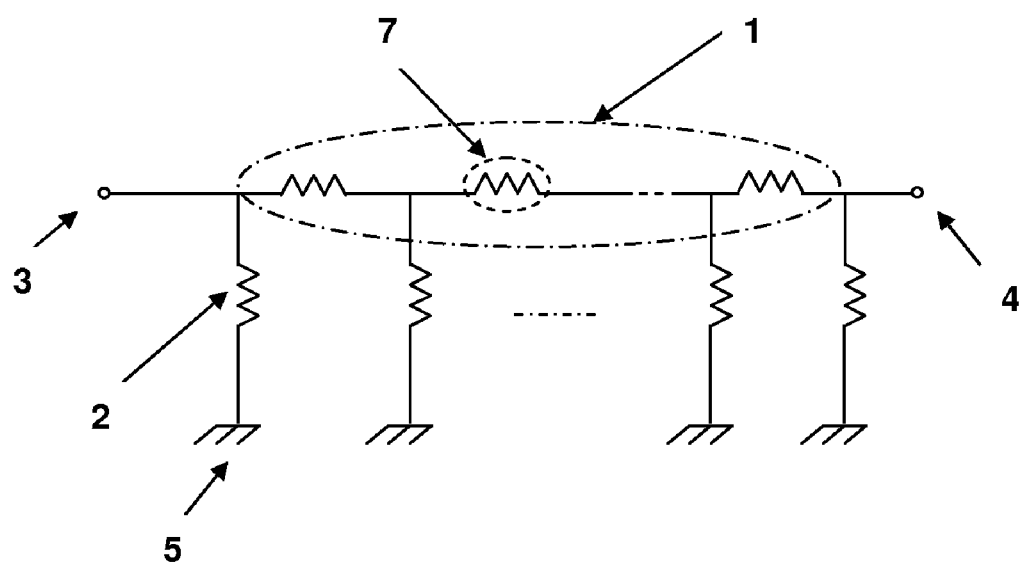
FIG. 2 is an equivalent circuit diagram of the temperature compensation attenuator illustrated in FIG. 1.

With reference to FIG. 2, the serial film thermistor is composed of a general film resistor the resistance of which is nearly invariable with temperature and the film thermistor 7.

Figure 3:
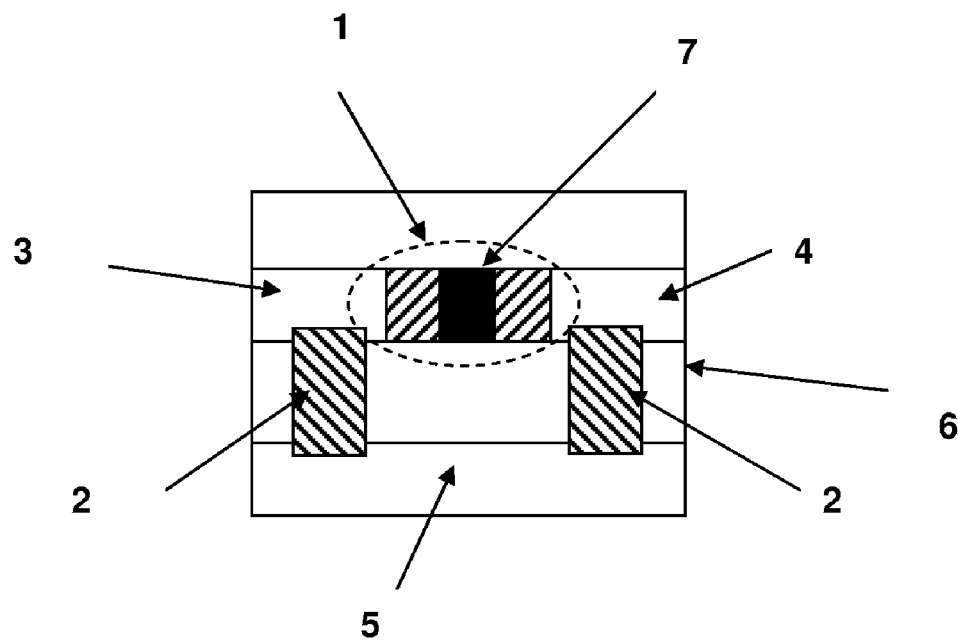
FIG. 3 is a schematic drawing of a temperature compensation attenuator according to the second embodiment of the invention.

With reference to FIG. 3, in a typical π-type attenuator of the invention, two ends of the serial film thermistor 1 are connected to the input terminal 3 and the output terminal 4, respectively. There are two parallel film resistors 2 having identical resistance values connected between the input terminal 3 and ground terminal 5 and connected between the output terminal 4 and the ground terminal 5, respectively. A film thermistor 7 having an NTC is disposed within the serial film thermistor 1. The π-type attenuator realizes stable temperature compensation.

Figure 4:
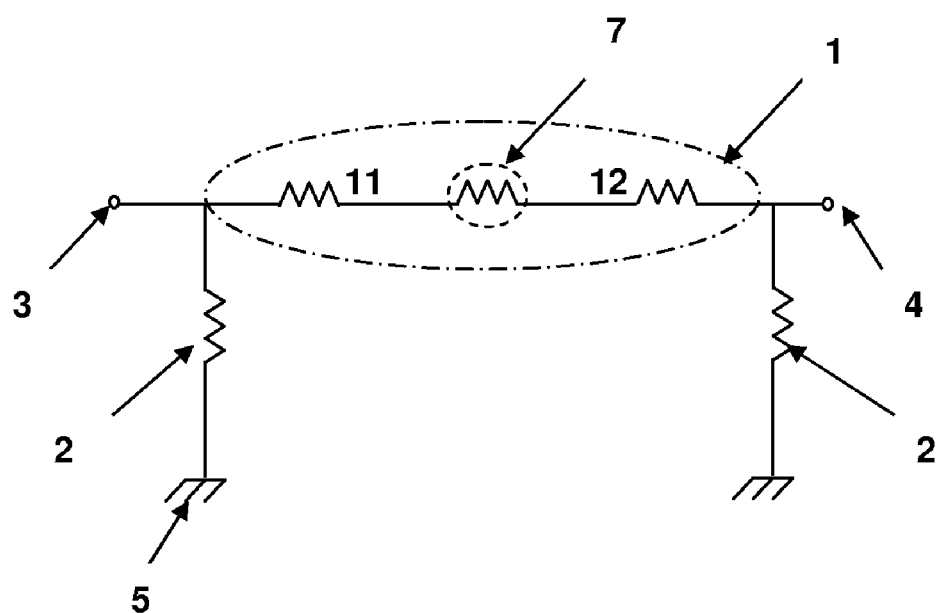
FIG. 4 is an equivalent circuit diagram of the temperature compensation attenuator illustrated in FIG. 3.

With reference to FIG. 4, the serial film thermistor 1 comprises film resistor 11, film thermistor 7 having a NTC, and film resistor 12.

Figure 5:
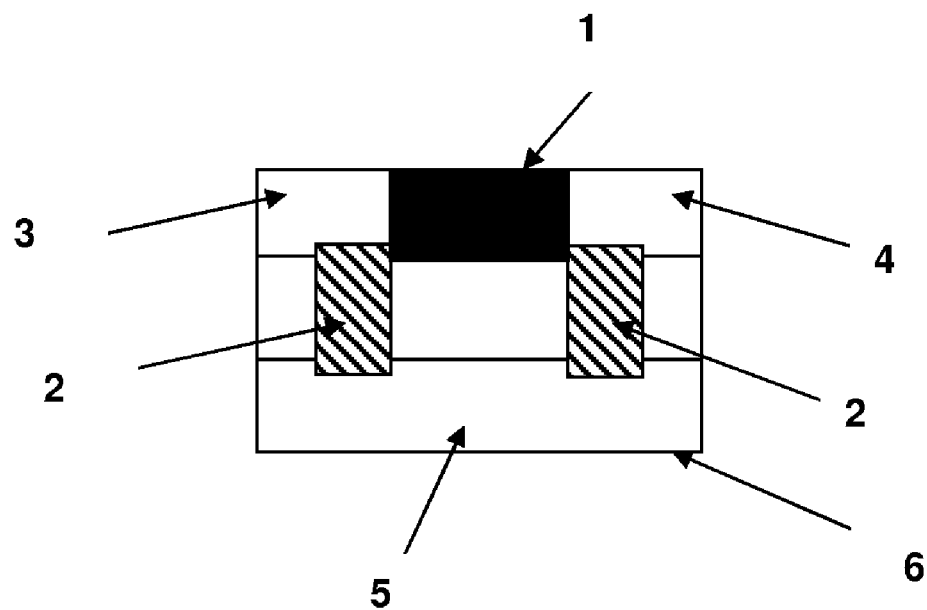
FIG. 5 is a schematic drawing of a temperature compensation attenuator according to the third embodiment of the invention.

With reference to FIG. 5, the serial film thermistor 1 is an entire film thermistor having an NTC. This attenuator is similar in type to that FIG. 3.

Figure 6:
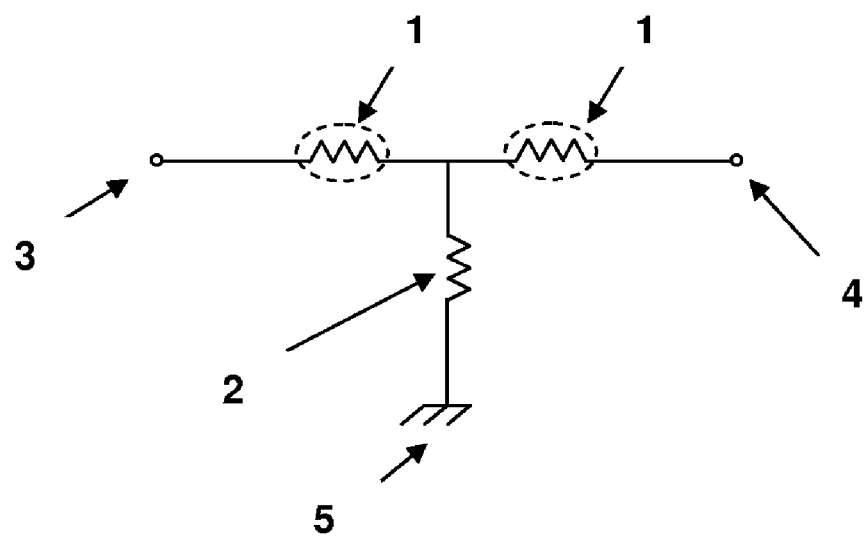
FIG. 6 is an equivalent circuit diagram of a T-type attenuator according to another embodiment of the invention.

With reference to FIG. 6, a T-type attenuator is composed of two serial film thermistors and a parallel film resistor, wherein a portion of or the entire serial film resistor is a film thermistor having a NTC. The resistance value of the serial film thermistor is identical with that of the serial film thermistor.

Figure 7:
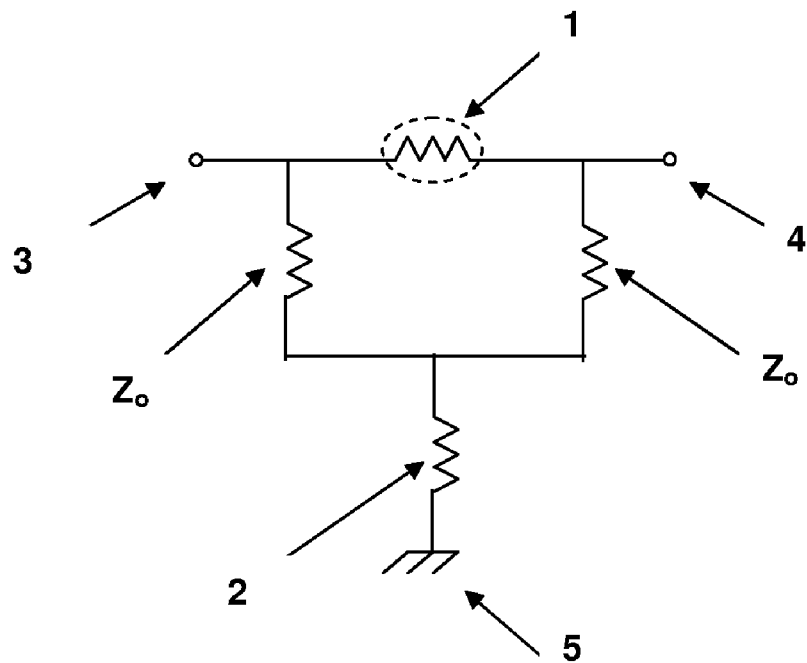
FIG. 7 is an equivalent circuit diagram of a bridge-type attenuator according to another embodiment of the invention.

With reference to FIG. 7, in a bridge-type attenuator, a portion of or the entire serial film resistor is a film thermistor having an NTC. The resistor $Z_o$ of the bridge-type attenuator is a film resistor with the resistance value of 50 Ohm.

Figure 8:
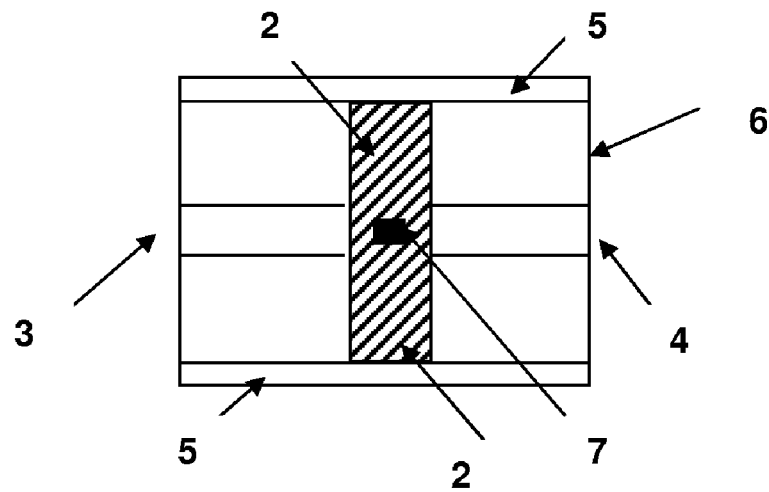
FIG. 8 is a schematic drawing of a temperature compensation attenuator according to the fourth embodiment of the invention.

With reference to FIG. 8, the attenuator is a combination of a π-type and a T-type attenuator. A portion of or the entire serial film thermistor 1 is a film thermistor having an NTC.

Figure 9:
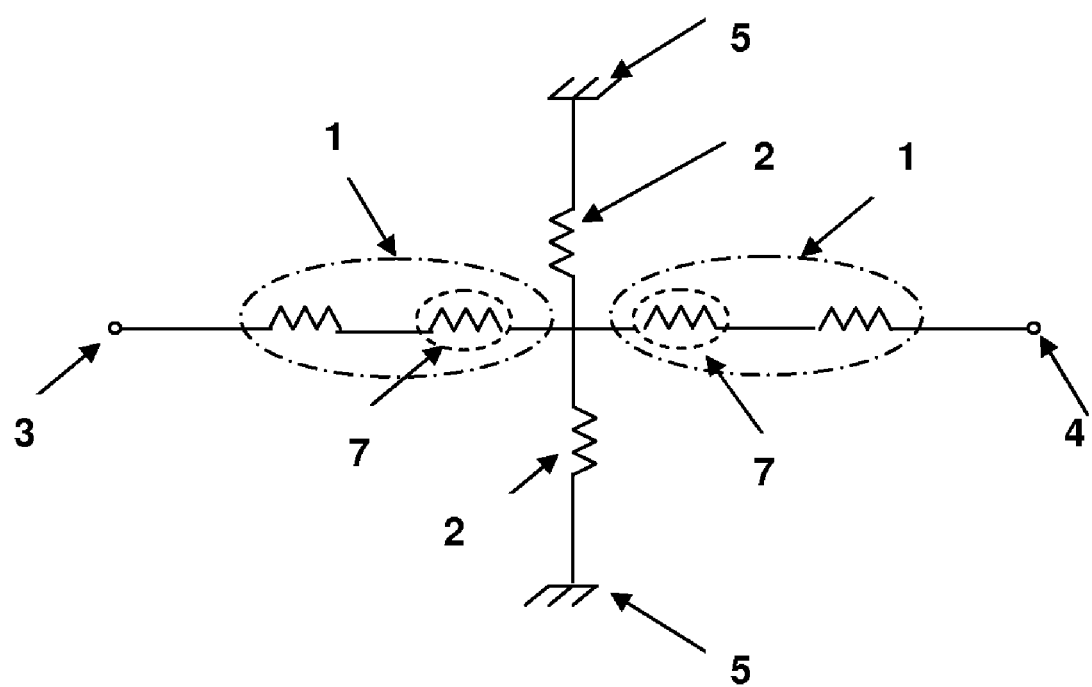
FIG. 9 is an equivalent circuit diagram of the temperature compensation attenuator illustrated in FIG. 8.

With reference to FIG. 9, the parallel film resistor 2 is comprises two parallel film resistors. The parameters of the temperature compensation attenuator are chosen according to the design rule for attenuators.

Disposing the temperature compensation attenuator into a coaxial connector enables direct access to system, and easy implementation of temperature compensation for systems without temperature compensation loop. The coaxial connector can be a SMA connector, an N-type connector, a BNC connector, or any other type of coaxial connector.

The film thermistor used in attenuators according to the invention can have a positive temperature coefficient (PTC).

This invention is not to be limited to the specific embodiments disclosed herein and modifications for various applications and other embodiments are intended to be included within the scope of the appended claims. While this invention has been described in connection with particular examples thereof, the true scope of the invention should not be so limited since other modifications will become apparent to the skilled practitioner upon a study of the drawings, specification, and following claims.

All publications and patent applications mentioned in this specification are indicative of the level of skill of those skilled in the art to which this invention pertains. All publications and patent applications mentioned in this specification are herein incorporated by reference to the same extent as if each individual publication or patent application mentioned in this specification was specifically and individually indicated to be incorporated by reference.

What is claimed is:

1. A temperature compensation attenuator comprising
    a base (6);
    a serial film thermistor (1) having two ends;
    a parallel film resistor (2);
    an input terminal (3); and
    an output terminal (4);
wherein
    said serial film thermistor (1) and said parallel film resistor (2) are disposed on said base (6);
    said input terminal (3) and said output terminal (4) are connected to the two ends of said serial film resistor (1);
    said serial film thermistor (1) comprises at least one area of substantially constant resistance over a temperature range and at least one area of variable resistance over a temperature range; and
    said parallel film resistor (2) does not comprise a thermistor.

2. The attenuator of claim 1, wherein said area of variable resistance over a temperature range has a negative temperature coefficient.

3. The attenuator of claim 1, said attenuator being a π-type attenuator, a T-type attenuator, or a bridge-type attenuator.

4. The attenuator of claim 1, wherein said serial film thermistor (1) is a thick film resistor or a thin film resistor.

5. The attenuator of claim 1, wherein said parallel film resistor (2) is a thick film resistor or a thin film resistor.

6. The attenuator of claim 1, wherein said attenuator is fabricated in a coaxial connector, and said coaxial connector is an SMA coaxial connector, an N-type coaxial connector, and a BNC connector.

7. A temperature compensation attenuator comprising
a base (6);
a serial film thermistor (1) having two ends;
a parallel film resistor (2);
an input terminal (3); and
an output terminal (4);
wherein
said serial film thermistor (1) and said parallel film resistor (2) are disposed on said base (6);
said input terminal (3) and said output terminal (4) are connected to the two ends of said serial film resistor (1);
said serial film thermistor (1) is a part thermistor, part resistor; and
said parallel film resistor (2) does not comprise a thermistor.

8. The attenuator of claim 7, wherein said area of variable resistance over a temperature range has a negative temperature coefficient.

9. The attenuator of claim 7, said attenuator being a π-type attenuator, a T-type attenuator, or a bridge-type attenuator.

10. The attenuator of claim 7, wherein said serial film thermistor (1) is a thick film resistor or a thin film resistor.

11. The attenuator of claim 7, wherein said parallel film resistor (2) is a thick film resistor or a thin film resistor.

12. The attenuator of claim 7, wherein said attenuator is fabricated in a coaxial connector, and said coaxial connector is an SMA coaxial connector, an N-type coaxial connector, and a BNC connector.

* * * * *